United States Patent [19]

Marsh, Jr.

[11] 3,855,535

[45] Dec. 17, 1974

[54] PROGRAMMING SYSTEM FOR A MOTOR-DRIVEN TELEVISION RECEIVER TUNING APPARATUS

[75] Inventor: James Courtland Marsh, Jr., Indianapolis, Ind.

[73] Assignee: RCA Corporation, New York, N.Y.

[22] Filed: May 22, 1973

[21] Appl. No.: 362,713

[52] U.S. Cl. .................................... 325/471, 334/8

[51] Int. Cl. ............................................ H04b 1/16

[58] Field of Search ........... 325/391, 393, 471, 465, 325/470; 334/1, 8, 14, 15, 20, 21, 49

[56] References Cited

UNITED STATES PATENTS

| | | | |
|---|---|---|---|
| 3,610,817 | 10/1971 | Bridgewater | 325/470 |
| 3,629,708 | 12/1971 | Thurnell | 325/465 |
| 3,743,944 | 7/1973 | Bridgewater | 325/471 |

*Primary Examiner*—Benedict V. Safourek
*Assistant Examiner*—George H. Libman
*Attorney, Agent, or Firm*—Eugene M. Whitacre; Lawrence W. Lunn

[57] ABSTRACT

A motor driven television receiving tuning apparatus in which a rotor contact of a channel selector switch provides selection of one of a plurality of preset potentiometer voltages required for tuning a voltage tunable tuner. Bypassing or stopping of the rotor at a particular stator contact of the channel selector switch is determined by the voltage level at the adjustable contact of the potentiometer connected to the stator contact. If the voltage coupled to the rotor contact is in a select range the motor will be activated by a motor control coupled to a program circuit. If the voltage coupled to the rotor contact is not within the select range, the motor will stop and couple the tuning voltage to the associated tuner.

5 Claims, 2 Drawing Figures

PROGRAMMING SYSTEM FOR A MOTOR-DRIVEN TELEVISION RECEIVER TUNING APPARATUS

Figures 1, 2:
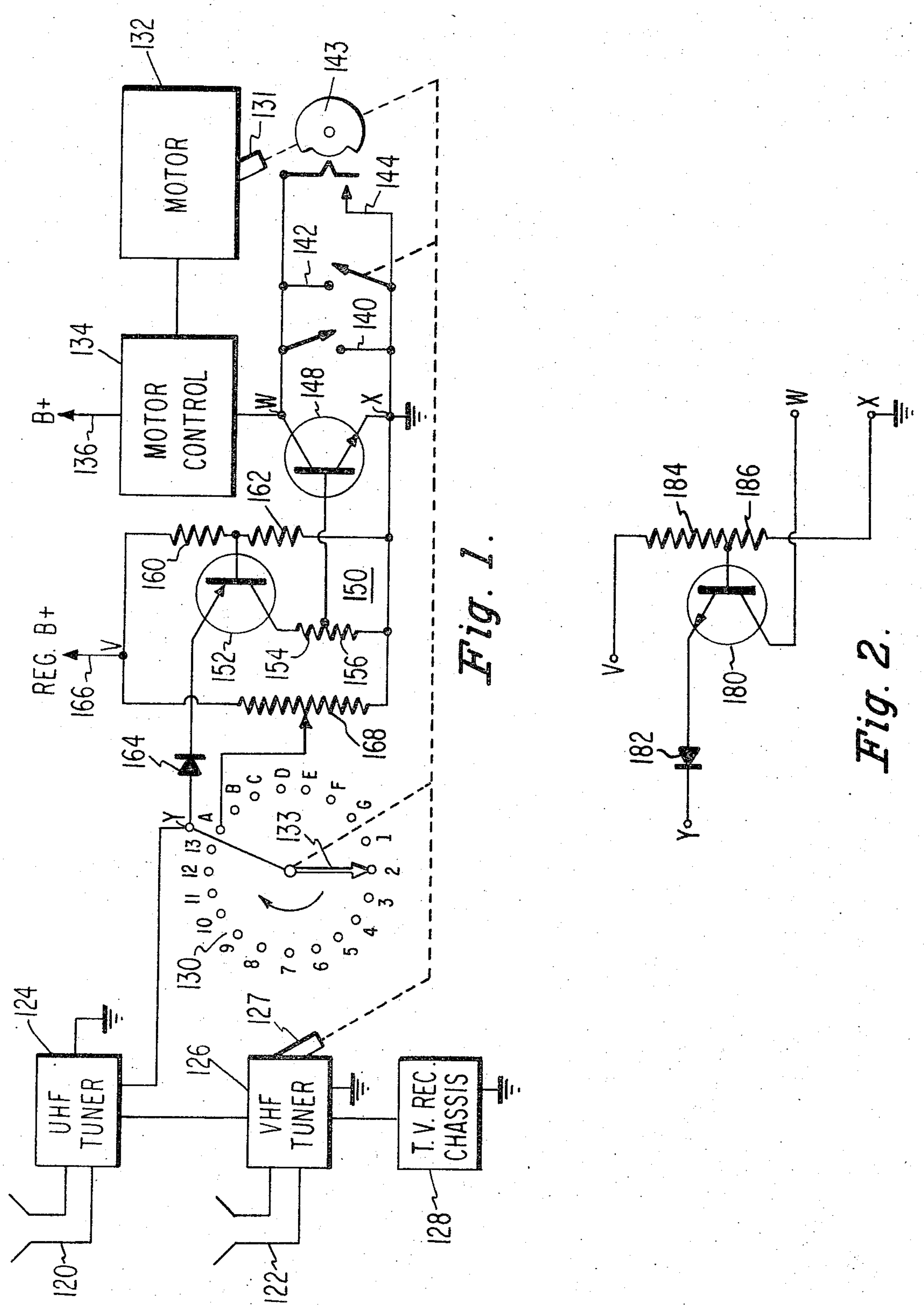

The present invention relates to motor driven television receiver tuning apparatus and more particularly to a system for providing a selective bypassing of stator contact positions associated with a channel selector switch used for channel tuning of a voltage tunable tuner.

U.S. Pat. application Ser. No. 143,858, entitled, "Automatic Tuning Control Circuit," filed May 17, 1971, in the name of Thomas Austin Bridgewater and assigned to RCA Corporation, now U.S. Pat. No. 3,743,944, describes a television receiver tuning apparatus wherein channel selection is accomplished using a motor driven channel selector switch to connect one of a plurality of tuning voltages provided by a plurality of potentiometers to a voltage tunable tuner.

Each potentiometer has an auxiliary switch associated therewith which is closed when the potentiometer is adjusted to one end of its adjustment range. This switch, when closed, will prevent the motor from stopping at that channel position.

In accordance with the present invention, a motor driven television receiver tuning apparatus employs a voltage tunable tuner capable of processing signals in a band of frequencies. A plurality of potentiometers each having an adjustable contact for providing a preset tuning voltage is provided. A channel selector switch having a plurality of stator contacts, each connected to one of the adjustable contacts, and a rotor contact connected to the voltage tunable tuner is also provided. The channel selector switch thereby permits coupling of one of the preset tuning voltages to the voltage controllable tuner at each of the plurality of stator contacts.

The system is arranged for providing selective bypassing of the stator contacts. A motor is coupled to the channel selector switch. A motor control is coupled to the motor for providing selective energization of the motor. Means are coupled to the rotor contact of the channel selector switch for sensing a predetermined condition or select range of voltage on the rotor contact and for providing a switching current when the predetermined condition is sensed. Means are provided to couple the switching current to the motor control to cause bypassing of that stator contact.

The present invention will be better understood from the drawing and the description thereof wherein:

FIG. 1 is a circuit diagram, partly in block form, of a motor driven television receiving tuning apparatus including a first embodiment of the invention; and FIG. 2 is a circuit diagram of an alternate programming circuit to be used in conjunction with motor driven television receiving tuning apparatus of FIG. 1.

In FIG. 1, a UHF antenna 120 and a VHF antenna 122 are used for the interception of signals corresponding to UHF and VHF television channels 14–83 and 2—, respectively. The UHF antenna 120 is coupled to a UHF tuner 124 and the VHF antenna 122 is coupled to a VHF tuner 126. The UHF tuner 124 is of a voltage tunable (varactor) type and processes the television signals in the UHF band (470–890 MHz) to convert radio frequency (RF) signals to intermediate frequency (IF) signals. The VHF tuner 126 is of a mechanical switch type having a 13 position shaft 127 for channel selection and processes television signals in the VHF band (54–216 MHz) to convert RF signals to IF signals in 12 of the 13 positions of the 13 position shaft and in an additional position converts the VHF tuner 126 to an IF preamplifier for converted UHF signals.

An IF output terminal of the UHF tuner 124 is coupled to an IF input terminal of the VHF tuner 126, thereby providing for coupling of the IF produced by the UHF tuner 124 into the VHF tuner 126 for IF preamplification. An IF output terminal of the VHF tuner 126 is coupled to TV receiver chassis 128 for further processing of the IF to produce a video display and audio reproduction.

The 13 position shaft 127 is mechanically coupled to a channel selector switch 130 and a shaft 131 of a motor 132 in the manner described, for example, in U.S. Pat application Ser. No. 344,297, entitled, "Parity of Tuning Apparatus," filed Mar. 23, 1973, in the name of Walter Franklin Speer et al. and assigned to RCA Corporation. The motor 132 drives a rotor contact 133 of the channel selector switch 130 with respect to a plurality of stator contacts 2–13 (corresponding to VHF channels) and A–H (corresponding to eight preselected UHF channels). The motor 132 also drives shaft 127 through its 13 channel positions in coordination with the rotor 133 of channel selector switch 130. The shaft 127 is also arranged to provide IF preamplifier operation of the VHF tuner 126 when rotor 133 is in stator contact positions A–H.

The motor 132 is coupled to a motor control 134 which serves to selectively activate the motor 132 in response to a switching current. The motor control 134 is coupled to a B+ supply 136 which provides a source of the switching current for motor control 134. A manual channel switch 140, a VHF program switch 142 and a detent switch 144 are coupled between the motor control 134 and ground potential to provide a path for selectively energizing motor control 134.

The program switch 142, which may be preset by the television receiver viewer to close when the rotor contact 133 is in any of the contact positions 2–13, is mechanically coupled to the shaft 131 of motor 132. A cam 143 operatively associated with detent switch 144 and coupled to the shaft 131 closes detent switch 144 when the rotor contact 133 is between stator contacts and opens when the rotor contact 133 is contacting any of the stator contacts.

A UHF programming circuit 150 comprises a transistor 148, a transistor 152, a resistor 154, a resistor 156, a resistor 160, a resistor 162 and a diode 164. Transistor 148, having a collector electrode coupled to motor control 134 and an emitter electrode coupled to ground, provides a path for the switching current which operates the motor control 134. Transistor 152 has a collector electrode coupled to the resistor 154 in series combination with the resistor 156, the resistor 156 being returned to ground. The junction of the resistor 154 and the resistor 156 is coupled to the base of transistor 148.

A regulated B+ supply 166 is coupled to the series combination of resistors 160 and 162. The junction of resistors 160 and 162 is coupled to the base of transistor 152 so as to provide a regulated base voltage to transistor 152.

A plurality of potentiometers **168*a–h*** resistive elements which are coupled between the regulated B+ supply 166 and ground. Adjustable contacts of the plurality of potentiometers 168*a–h* are each coupled to a respective one of the plurality of stator contacts A–H of channel selector switch 130.

The rotor contact 133 is coupled to the UHF tuner 124, thus providing a tuning voltage to tuner 124 corresponding to the voltage at the selected stator contact (e.g., "A"). The rotor 133 is also coupled to the anode of diode 164. The cathode of diode 164 is coupled to the emitter of transistor 152.

In operation, VHF signals intercepted by VHF antenna 122 are selectively processed by VHF tuner 126 in accordance with the position of 13 position shaft 127. The resultant IF signal is coupled to TV receiver chassis 128 which produces a video display and an audio reproduction. As shown in FIG. 1, the 13 position shaft 127 is in the channel 2 position and the rotor of channel selector switch is coupled to stator contact 2. To select a channel other than VHF channel 2 by means of motor 132 the operator momentarily closes the manual channel switch 140 which causes switching current to flow from B+ supply 136 through motor control 134 to ground via manual channel switch 140. The motor control is therefore activated and motor 132 starts to run. The shaft 131 of motor 132 rotates cam 143, rotor contact 133 and the 13 position shaft 127. The rotor contact rotates clockwise, cam 143 closes detent switch 144 and 13 position shaft 127 moves from the channel 2 position. Because of the closure of detent switch 144, the motor 132 continues to run independent of subsequent opening of manual channel switch 140. As the stator contact 3 of channel selector switch 130 is contacted, detent switch 144 opens, the switching current stops flowing and therefore, motor 132 stops.

If program switch 142 is programmed to close on any of the 12 positions of the 13 position shaft 127 required for reception of VHF channels 2–13, that position will be skipped. Skipping occurs because the motor 132 continues to run until both program switch 142 and detent switch 144 are open.

If manual channel switch 140 is closed a second time, the rotor contact 133 and 13 position shaft 127 will be rotated by motor 132 to the next channel position where detent switch 144 and program switch 142 are both open. Repeated closures of manual channel switch 140 will thus rotate the rotor contact 133 through channels 2–13.

Assuming that the program switch 142 is programmed to open on the channel 13 position of channel selector switch 130, after a predetermined number of closures of manual channel switch 140, motor 132 will stop with the rotor 133 on contact 13 and 13 position shaft 127 in the channel 13 position.

An additional closure of channel selector switch 140 will start motor 132, shaft 131 will rotate the rotor 133 to contact A and 13 position shaft 127 to a position providing for IF preamplification operation by VHF tuner 126. With the rotor contact 133 in this position, the preset voltage on the adjustable contact of potentiometer 168*a* is coupled to UHF tuner 124 to provide for tuning of the UHF tuner 124 and is also coupled to the anode of diode 164 of the UHF programming circuit 150.

Signals intercepted by UHF antenna 120 are coupled to UHF tuner 124 and are selectively processed in accordance with the present voltage selected by channel selector switch 130. The resultant IF signals produced by the UHF tuner are amplified by the VHF tuner. IF signals at the output of the VHF tuner 126 are then processed through the TV receiver chassis as they are during VHF reception.

To provide for bypassing of contact A of channel selector switch 130, the adjustable contact of potentiometer 168*a* is adjusted to a select range of voltage or predetermined voltage condition which is outside the range of voltages required to tune UHF tuner 124. In the arrangement of FIG. 1, such a voltage is provided when the voltage at the anode of diode 164 is greater than the base voltage of transistor 152 by the sum of one $V_{be}$ drop (approximately 0.6 volt) and one diode voltage drop (approximately 0.6 volt). When such a voltage exists at the anode of diode 164, emitter current flows in transistor 152, thus creating a collector current flow substantially equal to the emitter current. The collector current of transistor 152 flows through resistor 156 and resistor 154 and the resulting voltage drop across resistor 156 provides a base drive for the transistor 148, switching transistor 148 on at a predetermined collector current level of transistor 152.

When transistor 148 is switched on, the motor control 134 is activated and motor 132 is energized and continues to run, thereby moving rotor 133 towards contact B. If any of the potentiometers 168*b–h* associated with stator contacts B–H are also adjusted within the select range of voltage, the respective position of channel selector switch 130 will be bypassed.

To provide for stopping of the rotor 133 on any one of the stator contacts A–H, the adjustable contact of a corresponding potentiometer 168*a–h* must be adjusted to produce a voltage within the tuning range and outside the select range of voltage. The range of voltages required to properly tune UHF tuner 124 will back bias the diode 164 and will not produce any significant emitter current in transistor 152 and, therefore, no significant voltage will be developed across resistor 156. With no drive available, transistor 148 will be cut off. The motor control 134 therefore will stop motor 132 whenever detent switch 144 opens at a contact of channel selector switch 130 at which a voltage outside the select range of voltage is provided.

Since diode 164 is back biased when a selected potentiometer provides a voltage to tune UHF tuner 124 to an allocated UHF channel, the stability of the tuning voltage will not be significantly affected by the programming circuit 150.

FIG. 2 is an alternate programming circuit to be used in conjunction with motor driven television receiver tuning apparatus of FIG. 1. The circuit of FIG. 2 is to be inserted into the circuit of FIG. 1 as a replacement for the programming circuit 150 and is coupled to terminal V, W, X and Y. Therefore, the collector of transistor 180 is coupled to motor control 134, the emitter of transistor 180 is coupled to the anode of diode 182 and the cathode of diode 182 is coupled to the rotor contact 133. A resistor 184 and a resistor 186 are serially connected between the regulated B+ and ground. The base of transistor 180 is coupled to the junction of resistors 184 and 186.

In operation, to bypass any one of the contact positions A–H of channel selector switch 130 the adjustable contact of the corresponding potentiometer 168*a–h* must be adjusted to a select range of voltage which is below the range of voltage required to tune UHF tuner 124 and which is less than the base voltage of transistor 180 minus one $V_{be}$ and one diode voltage drop. When this range of voltage exists at the cathode of diode 182 emitter current flows in transistor 180 and a collector current flows which is substantially equal to the emitter current. The collector current flows from B+ supply 136 and provides the switching current necessary to activate motor control 134. Motor 132 runs in response to motor control 134 activation and continues to run moving rotor 133 to contacts B–H of channel selector switch 130.

To provide for stopping of the rotor 133 at any of the stator contacts A–H, the adjustable contact of the corresponding potentiometer 168*a–h* must be adjusted to a voltage level above the select range of voltage. Voltages at the adjustable contact required to tune UHF tuner 124 provide for back biasing of diode 182, therefore, no emitter current flows in transistor 180. With no significant emitter current flowing in transistor 180, there will be insufficient collector current flowing to activate motor control 134 and the motor will be deenergized.

While the invention has been described in terms of a preferred embodiment, it will be recognized by persons skilled in the art that various modifications may be made without departing from the scope of the present invention. For example, circuit arrangements may be provided whereby the range of voltages which activate motor control 134 may be of opposite polarity as compared to that which is suitable for tuning the associated UHF tuner or such range may include voltages less than those suitable for tuning the UHF tuner.

What is claimed is:

1. In a motor driven television receiving tuning apparatus employing a voltage tunable tuner capable of processing signals associated wiht each of a plurality of signal channels in a band of frequencies, a system for providing selective bypassing of positions of a channel selector switch employed to provide for reception of selected ones of said plurality of signal channels, comprising:

a plurality of potentiometers each having an adjustable contact providing a preset voltage;

a channel selector switch including at least a plurality of stator contacts corresponding in number to said plurality of potentiometers, each connected to one of said adjustable contacts and rotor contacts connected to said voltage tunable tuner, said channel selector switch thereby providing for coupling of one of said preset voltages to said voltage tunable tuner at each of said plurality of stator contacts;

a motor having a shaft coupled to said rotor contact of said channel selector switch;

a motor control coupled to said motor for providing energization of said motor; and means coupled to said rotor contact of said channel selector switch for sensing a select range of voltage supplied from said plurality of potentiometers via said rotor and for providing a switching signal only when said select range is being sensed, said switching signal being coupled to said motor control to maintain energization of said motor.

2. The combination as in claim 1 wherein said means for sensing a selected range of voltage on said rotor and for providing a switching signal when said selected range is being sensed comprises:

a switching means having an input terminal coupled to said rotor contact of said channel selector switch, an output terminal coupled to said motor control and a bias potential terminal;

a source of bias potential coupled to said bias potential terminal of said switching means;

said switching means providing said switching signal at said output terminal when a predetermined voltage difference exists between said preset voltage on said input terminal and said bias potential.

3. The combination as in claim 2 wherein said switching means comprises:

a transistor having a base electrode coupled to said source of bias potential, an emitter electrode and a collector electrode coupled to said motor control;

a unilateral conducting device;

said unilateral conducting device coupled between said rotor contact of said channel selector switch and said emitter of said transistor;

said unilateral conducting device being poled for efficient current flow between said base electrode of said transistor and said rotor contact of said channel selector switch.

4. The combination as in claim 2 wherein said switching means comprises:

a first transistor having a base electrode, an emitter electrode coupled to a reference potential, and a collector electrode coupled to said motor control;

a second transistor having a base electrode coupled to said source of bias potential, an emitter electrode and a collector electrode;

said first transistor and said second transistor being of opposite conductivity types;

a first resistor;

a second resistor;

said first resistor and said second resistor being coupled in a series combination and having a common terminal;

said series combination being coupled between said collector of said second transistor and said reference potential;

said base terminal of said first transistor being coupled to said common terminal;

a unilateral conducting device;

said unilateral conducting device coupled between said rotor contact of said channel selector switch and said emitter electrode of said second transistor;

said unilateral conducting device being poled for efficient current flow between said base electrode of said second transistor and said rotor contact of said channel selector switch.

5. In a motor driven television receiving tuning apparatus employing a voltage tunable tuner capable of processing signals associated with each of a plurality of signal channels in a band of frequencies, a system for providing selective bypassing of positions of a channel selector switch employed to provide for reception of selected ones of said plurality of signal channels, comprising:

a plurality of potentiometers each having an adjustable contact providing a preset voltage;

a channel selector switch including at least a plurality of stator contacts corresponding in number to said plurality of potentiometers, each connected to one of said adjustable contacts and a rotor contact connected to said voltage tunable tuner, said channel selector switch thereby providing for coupling of one of said preset voltages to said voltage tunable tuner at each of said plurality of stator contacts;

a motor having a shaft coupled to said rotor contact of said channel selector switch;

a motor control coupled to said motor for providing energization of said motor;

source of bias potential;

a first transistor having a base electrode, an emitter electrode coupled to a reference potential, and a collector electrode coupled to said motor control;

a second transistor having a base electrode coupled to said source of bias potential, an emitter electrode and a collector electrode;

said first transistor and said second transistor being of opposite conductivity tapes;

a first resistor;

a second resistor;

said first resistor and said second resistor being coupled in a series combination and having a common terminal;

said series combination being coupled between said collector of said second transistor and said reference potential;

said base terminal of said first transistor being coupled to said common terminal;

a unilateral conducting device;

said unilateral conducting device coupled between said rotor contact of said channel selector switch and said emitter electrode of said second transistor;

said unilateral conducting device being poled for current flow between said base electrode of said second transistor and said rotor contact of said channel selector switch; and a switching signal being produced at said collector electrode of said first transistor when a forward bias current flows between said emitter electrode and said base electrode of said second transistor; said switching signal maintaining energization of said motor.

* * * * *